US012453531B2

(12) United States Patent
Sudol et al.

(10) Patent No.: US 12,453,531 B2
(45) Date of Patent: Oct. 28, 2025

(54) ELECTRICAL WIRE CONNECTION IN ULTRASOUND IMAGING DEVICES, SYSTEMS, AND METHODS

(71) Applicant: KONINKLIJKE PHILIPS N.V., Eindhoven (NL)

(72) Inventors: Wojtek Sudol, Andover, MA (US); Johannes Wilhelmus Weekamp, Beek en Donk (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 54 days.

(21) Appl. No.: 17/258,478

(22) PCT Filed: Jul. 9, 2019

(86) PCT No.: PCT/EP2019/068318
§ 371 (c)(1),
(2) Date: Jan. 7, 2021

(87) PCT Pub. No.: WO2020/011741
PCT Pub. Date: Jan. 16, 2020

(65) Prior Publication Data
US 2021/0128110 A1    May 6, 2021

Related U.S. Application Data

(60) Provisional application No. 62/695,977, filed on Jul. 10, 2018.

(51) Int. Cl.
*A61B 8/00*    (2006.01)
*H05K 1/18*    (2006.01)
(Continued)

(52) U.S. Cl.
CPC ............... *A61B 8/445* (2013.01); *A61B 8/56* (2013.01); *H05K 1/181* (2013.01); *A61B 8/0883* (2013.01);
(Continued)

(58) Field of Classification Search
CPC ......... A61B 8/445; A61B 8/56; A61B 8/0883; A61B 8/12; H05K 1/181; H05K 2201/10356; H05K 1/0271
See application file for complete search history.

(56) References Cited

U.S. PATENT DOCUMENTS 5,797,848 A    8/1998    Marian
5,857,974 A    1/1999    Eberle
(Continued)

FOREIGN PATENT DOCUMENTS

| CN | 105470668 A * | 4/2016 | ......... H01R 13/6585 |
| WO | WO-2014114972 A1 * | 7/2014 | ............. H01R 12/71 |
| WO | 2018060061 A1 | 4/2018 | |

OTHER PUBLICATIONS

International Search Report & Written Opinion of PCT/EP2019/068318, dated Oct. 2, 2019.

*Primary Examiner* — Joel Lamprecht
*Assistant Examiner* — James F McDonald, III

(57) ABSTRACT

A system includes an intraluminal device configured to be positioned within a body lumen of a patient, the intraluminal device comprising a proximal portion and a distal portion, wherein the intraluminal device further comprises: a sensor disposed at the distal portion; a proximal connector comprising a printed circuit board assembly (PCBA) configured to interface with a user console and disposed at the proximal portion; and a plurality of electrical wires connecting the sensor and the proximal connector, wherein the plurality of electrical wires are terminated at an angle on the PCBA such (Continued)

that the PCBA and electrical wires terminated thereon together are configurable to form a cross-section of 2 mm2 or less.

17 Claims, 11 Drawing Sheets

(51) Int. Cl.
    *A61B 8/08* (2006.01)
    *A61B 8/12* (2006.01)
(52) U.S. Cl.
    CPC ...... *A61B 8/12* (2013.01); *H05K 2201/10356* (2013.01)

(56) References Cited

U.S. PATENT DOCUMENTS

| | | | | |
|---|---|---|---|---|
| 6,283,921 B1* | 9/2001 | Nix | ...................... | A61B 8/4488 600/467 |
| 10,332,863 B2* | 6/2019 | Val | .......................... | H01L 24/20 |
| 2006/0100618 A1* | 5/2006 | Chan | ................. | A61B 18/1492 606/41 |
| 2006/0116584 A1* | 6/2006 | Sudol | ....................... | A61B 8/12 600/459 |
| 2010/0197150 A1* | 8/2010 | Smejtek | ................. | H05K 3/366 439/62 |
| 2010/0280388 A1* | 11/2010 | Huang | .................. | B06B 1/0292 53/461 |
| 2012/0172842 A1* | 7/2012 | Sela | ........................ | A61B 5/066 604/528 |
| 2012/0283570 A1 | 11/2012 | Tegg | | |
| 2013/0267853 A1* | 10/2013 | Dausch | ................ | A61B 8/4494 600/459 |
| 2013/0303919 A1* | 11/2013 | Corl | ....................... | A61B 8/445 600/467 |
| 2014/0012130 A1* | 1/2014 | Jacobsen | ................ | H05K 1/028 600/424 |
| 2014/0187965 A1* | 7/2014 | Reiter | .................... | A61B 8/445 600/467 |
| 2014/0321244 A1 | 10/2014 | Lee | | |
| 2015/0359510 A1* | 12/2015 | Currlin | ................ | A61B 8/0891 600/467 |
| 2016/0351292 A1* | 12/2016 | Toth | ................... | A61B 18/1492 |
| 2017/0042508 A1* | 2/2017 | Havel | ....................... | A61B 8/12 |
| 2017/0086746 A1* | 3/2017 | Ofek | ...................... | A61B 5/746 |
| 2017/0156691 A1* | 6/2017 | Cabrera-Munoz | ..... | A61B 8/461 |
| 2017/0209898 A1* | 7/2017 | Henneken | ............. | B06B 1/0292 |
| 2017/0265844 A1* | 9/2017 | Nishiwaki | ................ | A61B 8/54 |
| 2018/0098821 A1* | 4/2018 | Saul | ........................ | A61B 8/12 |
| 2018/0279994 A1* | 10/2018 | Schaer | ................. | A61B 8/0883 |
| 2019/0148853 A1* | 5/2019 | Heilemann | ............. | H05K 3/34 174/255 |
| 2021/0338198 A1* | 11/2021 | Wrolstad | ............... | A61B 8/445 |

* cited by examiner

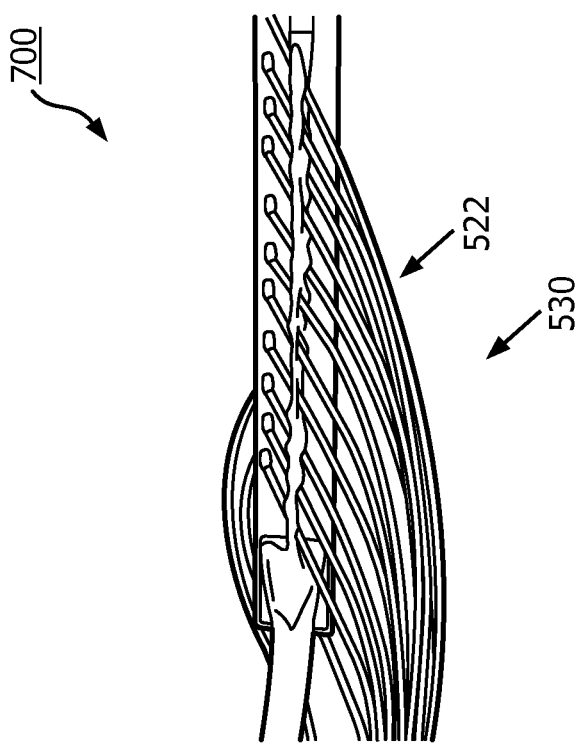
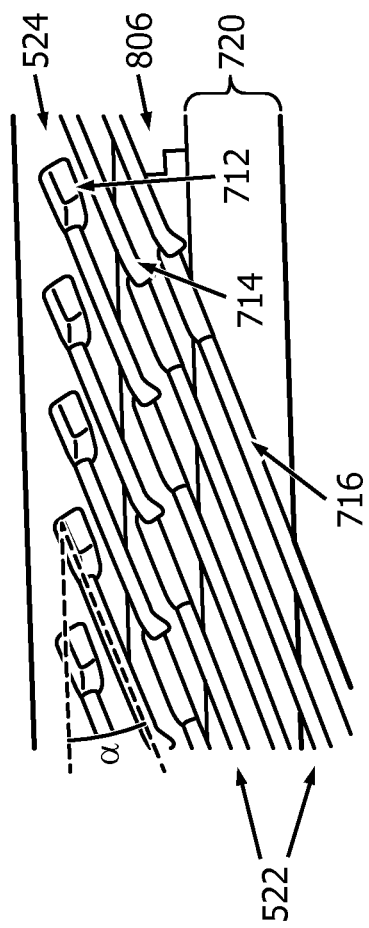
FIG. 6A
FIG. 6B

ELECTRICAL WIRE CONNECTION IN ULTRASOUND IMAGING DEVICES, SYSTEMS, AND METHODS

TECHNICAL FIELD

The present disclosure relates generally to ultrasound imaging systems, and in particular, to electrical wire connections for imaging catheters, such as intra-cardiac echocardiography (ICE) catheters.

BACKGROUND

Diagnostic and therapeutic ultrasound catheters have been designed for use inside many areas of the human body. In the cardiovascular system, a common diagnostic ultrasound methods is intraluminal ultrasound imaging with intra-cardiac echocardiography (ICE) being a specific example of intraluminal imaging. Typically, a single rotating transducer or an array of transducer elements is used to transmit ultrasound at the tips of the catheters. The same transducers are used to receive echoes from the tissue. A signal generated from the echoes is transferred to a console which allows for the processing, storing, display, or manipulation of the ultrasound-related data.

Intraluminal imaging catheters, such as ICE catheters (e.g., Siemens Acunav, St. Jude ViewFlex), are generally used to image heart and surrounding structures, for example, to guide and facilitate medical procedures, such as transseptal lumen punctures, left atrial appendage closures, atrial fibrillation ablation, and valve repairs. Commercially-available ICE catheters have distal ends which can be articulated by a steering mechanism located in a handle at the proximal end of the catheter. For example, an intraluminal imaging catheter such as an ICE catheter may be inserted through the femoral or jugular vein when accessing the anatomy, and steered in the heart to acquire images necessary to the safety of the medical procedures.

An ICE catheter may include electrical wires that are connected to an imaging assembly at the distal portion of the catheter and that transmit electrical signals representative of commands or ultrasound data. Generally, the imaging assembly is larger than an internal cavity of the catheter, such that the imaging core cannot be passed or sneaked through the internal cavity. Therefore, the electrical wires are sneaked through the catheter before the imaging core is attached to the catheter wire. However, the catheter may be damaged during handling after the imaging assembly is attached. For example, manufacturing steps on the imaging assembly (such as precise alignment, bonding, wirebonding, and overcoating) may cause damage the delicate catheter. Furthermore, the electrical wires and imaging assembly may require multiple testing steps after being assembled to ensure quality.

SUMMARY

An ultrasound imaging system is provided by the present disclosure. The ultrasound imaging system can include a catheter assembly. The catheter assembly may include a distal portion, a proximal portion, and a cable extending between the distal and proximal portions. The cable includes a plurality of electrical wires that facilitate electrical signal communication between the ultrasound imaging assembly at the distal portion and an electronic component, such as a printed circuit board (PCB), at the proximal distal. The PCB can be part of a low profile proximal connector that is sized and shaped for passing through a catheter body after the electrical wires are attached. In that regard, the electrical wires can be attached to the connector at an angle relative to the orientation of the connector. The angled connection advantageously allows a more robust interconnection that is less prone to breaking while the PCB and electrical wires are passed through the entire length of the catheter body during manufacturing. This may reduce waste and help to alleviate manufacturing problems. The interconnection also allows for testing of the electrical connections during assembly of the catheter.

A system is provided by the present disclosure, which may include: an intraluminal device configured to be positioned within a body lumen of a patient, the intraluminal device comprising a proximal portion and a distal portion, wherein the intraluminal device further comprises: a sensor disposed at the distal portion; a proximal connector comprising a printed circuit board assembly (PCBA) configured to interface with a user console and disposed at the proximal portion; and a plurality of electrical wires connecting the sensor and the proximal connector, wherein the plurality of electrical wires are terminated at an angle on the PCBA such that the PCBA and electrical wires terminated thereon together are configurable to form a cross-section of 2 mm$^2$ or less.

In some aspects, the intraluminal device further comprises a sheath disposed around at least a portion of the plurality of wires and terminating on the PCBA. In some aspects, the sheath is braided. In some aspects, a length of the sheath prior to terminating at the PCBA is not disposed around the plurality of wires such that the length of the sheath runs parallel to a length of the wires. In some aspects, the sheath is terminated on the PCBA at a position distal to the termination of the plurality of electrical wires. In some aspects, the plurality of electrical wires are arranged to be foldable when the intraluminal device is passed through a catheter body. In some aspects, the angle is between 10 degrees and 80 degrees with respect to an orientation of the PCBA. In some aspects, the angle is between 30 and 60 degrees with respect to an orientation of the PCBA. In some aspects, each of the plurality of electrical wires is soldered onto a contact of the PCBA. In some aspects, the plurality of electrical wires are soldered along one or more lines extending a length of the PCBA. In some aspects, the wires are soldered along single line along a length of the PCBA. In some aspects, the plurality of electrical wires pass through an opening distal of the proximal portion of the intraluminal device. In some aspects, the intraluminal device comprises a knitted outer portion, wherein the opening is in the knitted outer portion. In some aspects, a proximal end of the knitted outer portion is coupled to a distal end of the PCBA.

A cabling assembly for a catheter is provided by the present disclosure. The cabling assembly defines a length between proximal and distal portions of the cabling assembly. The cabling assembly may include a sensor disposed at the distal portion; a printed circuit board assembly (PCBA) disposed at the proximal portion; and a cable connecting the sensor and the PCBA and comprising a plurality of electrical wires, wherein the plurality of electrical wires are angled with respect to the PCBA such that the PCBA and electrical wires together form a cross-section of 2 mm$^2$ or less.

In some aspects, the electrical wires are configured to move from a first position when placed in a shaft of the catheter to a second position when extending out of the shaft of the catheter.

A method of assembling an intraluminal ultrasound imaging device is provided by the present disclosure, which may include: coupling a distal portion of cable to an ultrasound transducer configured to obtain imaging data of a body lumen of a patient, the cable comprising a plurality of electrical wires; and coupling a proximal portion of the cable to a printed circuit board assembly (PCBA), wherein the plurality of electrical wires are terminated at an angle with respect to an orientation of the PCBA; and after attaching the cable to the ultrasound transducer and the PCBA, passing the PCBA and the cable through a catheter shaft; and coupling the PCBA to a proximal connector configured to interface with a patient interface module (PIM).

In some aspects, attaching the PCBA to the proximal connector comprises connecting the PCBA to a further PCBA within the proximal connector. In some aspects, passing the PCBA and the cable through the catheter shaft includes folding the electrical wires towards the PCBA. In some aspects, the angle is between 10 degrees and 80 degrees with respect to the orientation of the PCBA. In some aspects, the angle is between 30 and 60 degrees with respect to the orientation of the PCBA. In some aspects, coupling the proximal portion of the cable to the PCBA includes soldering each of the plurality of electrical wires onto a contact of the PCBA. In some aspects, coupling the proximal portion of the cable to the PCBA includes soldering the plurality of electrical wires along a single line extending across the PCBA. In some aspects, the method further includes passing the plurality of electrical wires through an opening distal of a proximal end of the cable. In some aspects, the cable comprises a knitted outer portion, and wherein passing the plurality of electrical wires through the opening includes passing the plurality of electrical wires through an opening in the knitted outer portion. In some aspects, the method further includes attaching a proximal end of the knitted outer portion of the cable to a distal end of the PCBA.

Additional aspects, features, and advantages of the present disclosure will become apparent from the following detailed description.

BRIEF DESCRIPTION OF THE DRAWINGS

Illustrative embodiments of the present disclosure will be described with reference to the accompanying drawings, of which:

FIG. 6A is a top view of the transition section of the catheter cable according to embodiments of the present disclosure.

FIG. 6B is a top view of the electrical wires of the transition section of the catheter cable according to embodiments of the present disclosure.

DETAILED DESCRIPTION

Figure 1A:
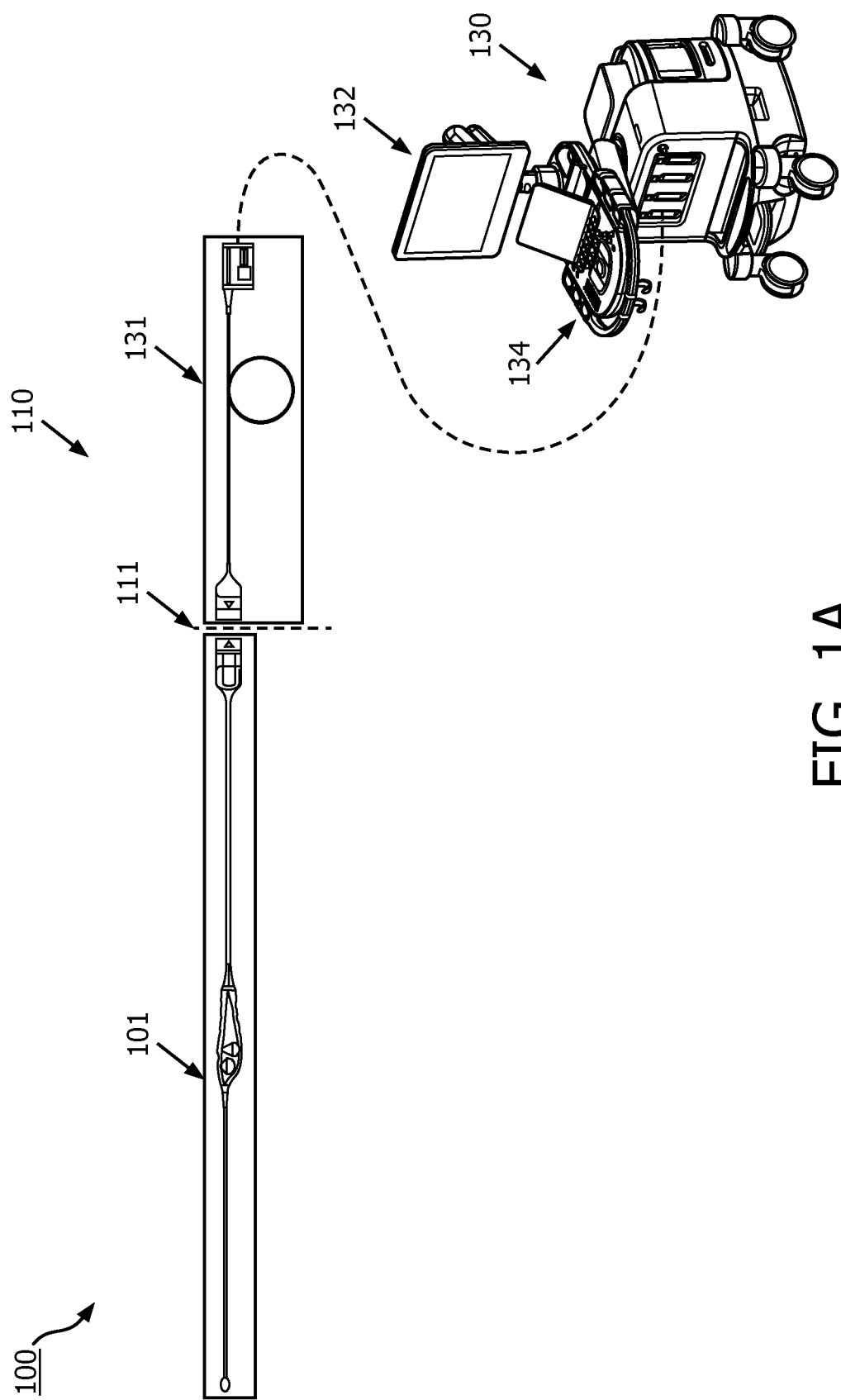
FIG. 1A is a schematic diagram of an intraluminal imaging system according to embodiments of the present disclosure.

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. For example, while the ICE system is described in terms of intraluminal imaging, it is understood that it is not intended to be limited to this application. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately.

FIG. 1A is a schematic diagram of an imaging system 100 according to embodiments of the present disclosure. The system 100 may include an intraluminal ultrasound imaging device 110, a control and processing system 130 (for example, a console including a computer), and a patient interface module (PIM) 131 extending between the device 110 and the control and processing system 130.

Figure 2:
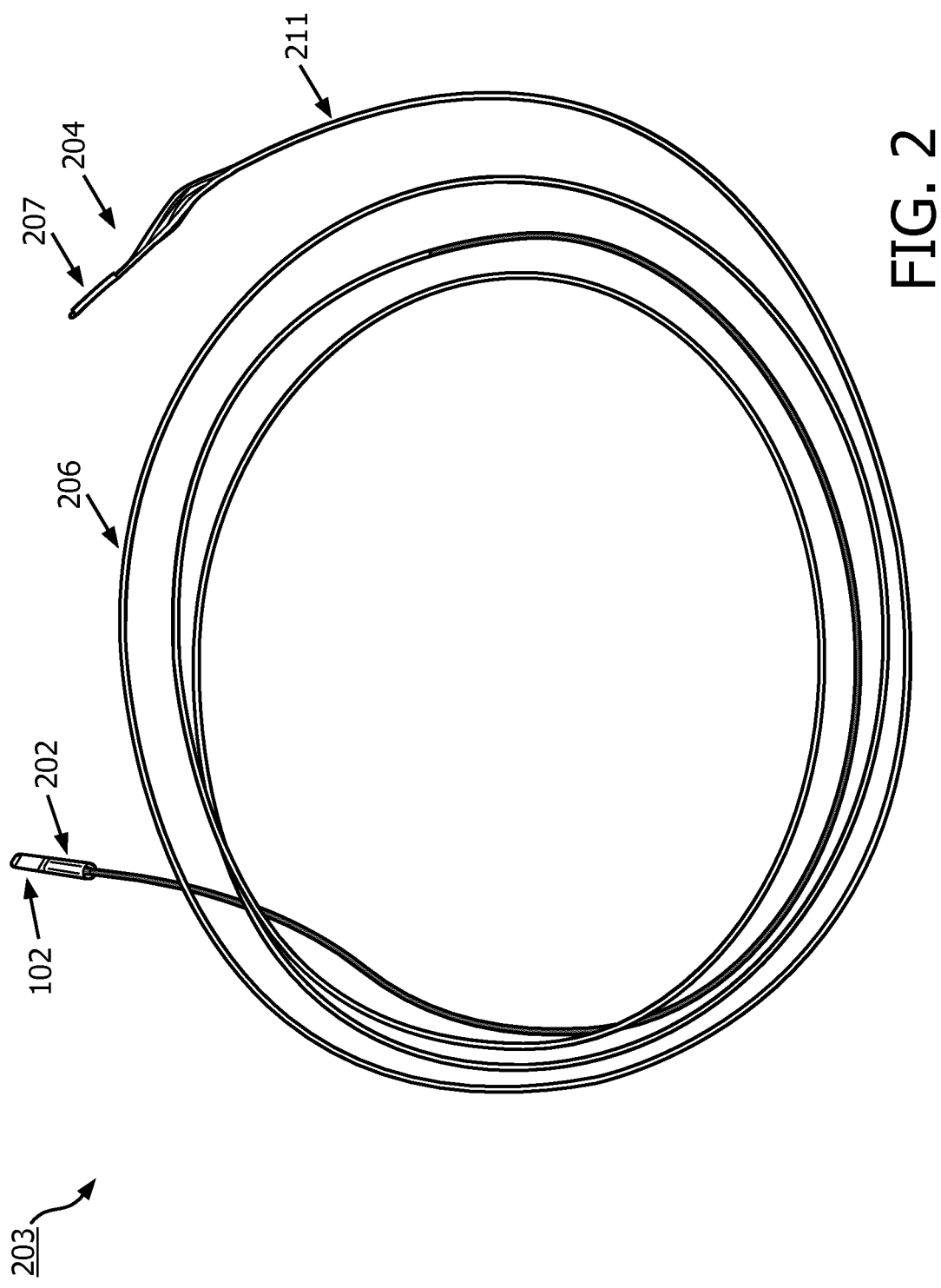
FIG. 2 is a perspective view of a catheter cable according to embodiments of the present disclosure.

The ultrasound imaging device 110 may include a catheter 101, which is shown in more detail in FIG. 2. The catheter 101 may include one or more flexible elongate members sized and shaped, structurally arranged, and/or otherwise configured to be positioned within a body lumen of a patient. In some embodiments, the catheter 101 includes an ultrasound imaging assembly 102, a catheter body or shaft 201, a catheter cable 203, a handle 120, a conduit 124, a connector 209, and one or more printed circuit board assemblies (PCBAs) 207. The catheter cable 203 may have a small diameter configuration and a low profile that is sized to be passed or sneaked through a catheter shaft 201, the handle 120, and/or the conduit 124. The cable 203 may be electrically and/or mechanically coupled to the ultrasound imaging assembly 102 at the distal portion of the catheter shaft 201, as well as the PCBA 207 at the proximal portion of the catheter 101.

In some embodiments, one or both of the catheter body/shaft 201 and catheter cable 203 may be referred to as a flexible elongate member. The catheter shaft 201 is sized and shaped, structurally arranged and/or otherwise configured to be positioned within a body lumen of a patient (e.g., vasculature such as blood vessels or chambers of the heart). Respective portions of the catheter cable 203 extend within the catheter shaft 201, the handle 120, the conduit 124, and the connector 209. The imaging assembly 102 may be attached it a distal end of the catheter shaft 201. The catheter shaft 201 may include a lumen that the catheter cable 203 may pass through. The proximal end 204 of the catheter shaft 201 may be attached to the handle 120, for example, by a resilient strain reliever. The handle 120 may be used for manipulation of the ultrasound imaging device 110 and manual control of the ultrasound imaging device 110. The ultrasound imaging device 110 may include an imaging assembly 102 with ultrasound transducer elements and associated circuitry. The handle 120 may include actuators 116, a clutch 114, and other steering control components for steering the ultrasound imaging device 110. The steering may include deflecting the distal end of the catheter cable 203, as described in greater details herein.

The catheter cable 203 may pass through one or more of the catheter shaft 201, handle 120, conduit 124, and connector 209. In some embodiments, during assembly, the catheter cable 203 is sneaked through a lumen within the catheter body 201, handle 120, and conduit 124. In some embodiments, the conduit 124 is a component distinct from the cable 203. For example, the conduit can be a tubing within which the cable 203 extends. In other embodiments, the conduit 124 can be a coating defining an exterior surface of the cable 203. The coating can strengthen the cable 203 for exposure to direct contact and/or handling by an operator of the catheter 101. The catheter cable 203 may be terminated at a PCBA 207 within the connector 209. The catheter cable 203 may be electrically and mechanically coupled to the imaging assembly 102 and may include a plurality of electrical wires.

The handle 120 may be connected to the conduit 124 via another strain reliever. The conduit 124 may be configured to provide suitable configurations for interconnecting the control and processing system 130 and the monitor 132 to the imaging assembly 102. The control and processing system 130 may be used for processing, storing, analyzing, and manipulating data, and the monitor 132 may be used for displaying obtained signals generated by the imaging assembly 102. The control and processing system 130 can include one or more processors, memory, one or more input devices, such as keyboards and any suitable command control interface device. The control and processing system 130 may be operable to facilitate the features of the intraluminal imaging system 100 described herein. For example, a processor can execute computer readable instructions stored on the non-transitory tangible computer readable medium. The monitor 132 may be any suitable display device, such as liquid-crystal display (LCD) panel or the like.

In operation, a physician or a clinician may advance the catheter 101 into a lumen, such as a blood vessel, body lumen, or portion of a heart anatomy. By controlling actuators 116 and/or the clutch 114 on the handle 120, the physician or clinician may steer the catheter 101 to a position near the area of interest to be imaged. For example, one actuator may deflect the imaging assembly 102 and a distal end of the catheter cable 203 in a left-right plane and the other actuator may deflect the imaging assembly 102 and the distal end of the catheter cable 203 in an anterior-posterior plane. The clutch 114 may provide a locking mechanism to lock the positions of the actuators 116 and in effect lock the deflection of the imaging assembly 102 while imaging the area of interest.

The imaging process may include activating the ultrasound transducer elements on the imaging assembly 102 to produce ultrasonic energy. A portion of the ultrasonic energy is reflected by the area of interest and the surrounding anatomy, and the ultrasound echo signals are received by the ultrasound transducer elements. The conduit 124 may be used to transfer the received echo signals to the control and processing system 130 where the ultrasound image is reconstructed and displayed on the monitor 132. In some embodiments, the processing system 130 can control the activation of the ultrasound transducer elements and the reception of the echo signals. In some embodiments, the control and processing system 130 and the monitor 132 may be part of a same system.

While some embodiments of the present disclosure refer to an imaging device, an ultrasound imaging device, or an intraluminal imaging device, it is understood that the ultrasound imaging device 110 and the system 100 generally may be used to image vessels, structures, lumens, and/or any suitable anatomy/tissue within a body of a patient including any number of anatomical locations and tissue types, including without limitation, organs including the liver, heart, kidneys, gall bladder, pancreas, lungs; ducts; intestines; nervous system structures including the brain, dural sac, spinal cord and peripheral nerves; the urinary tract; as well as valves within the blood, chambers or other parts of the heart, and/or other systems of the body. In addition to natural structures, the imaging device 110 may be may be used to examine man-made structures such as, but without limitation, heart valves, stents, shunts, filters and other devices. For example, the ultrasound imaging device 110 can be positioned within fluid filled or surrounded structures, both natural and man-made, such as within a body of a patient. The vessels, structures, lumens, and anatomy/tissue can include a blood vessel, as an artery or a vein of a patient's vascular system, including cardiac vasculature, peripheral vasculature, neural vasculature, renal vasculature, and/or any suitable lumen inside the body.

The system 100 can be referenced as an imaging system, ultrasound imaging system, intraluminal imaging system, and/or combinations thereof. Although the present disclosure refers to ICE catheters, any suitable intraluminal imaging device is contemplated, such as an intravascular ultrasound (IVUS) device, an optical coherence tomography (OCT) device, an intracardiac echocardiography (ICE) device, a transesophageal echocardiography (TEE) device, an intravascular photoacoustic (IVPA) imaging device, and/or any suitable internal imaging device. Intraluminal devices with flexible elongate members such as catheters, guide wires, and/or guide catheter are contemplated.

The system 100 may be utilized in a variety of applications such as transseptal punctures, left atrial appendage closures, atrial fibrillation ablation, and valve repairs and can be used to image vessels and structures within a living body. Although the system 100 is described in the context of intraluminal imaging procedures, the system 100 is suitable for use with any catheterization procedure. In addition, the imaging assembly 102 may include any suitable physiological sensor or component for diagnostic, treatment, and/or therapy. For example, the imaging assembly can include an imaging component, an ablation component, a cutting component, a morcellation component, a pressure-sensing component, a flow-sensing component, a temperature-sensing component, and/or combinations thereof. In some embodiments, the intraluminal imaging system 100 is used for generating two-dimensional and three-dimensional images.

Referring back to FIG. 1A, the PIM 131 may provide a physical and electrical connection between the ultrasound imaging device 110 and the control and processing system 130. Some embodiments of the present disclosure omit the PIM 131. In other embodiments, the PIM 131 is communicatively interposed between the ultrasound imaging device 110 and the processing system 130. In some instances, the PIM 131 can be referenced as a patient interface cable. For example, a proximal connector 209 of the ultrasound imaging device 110, a distal connector of the PIM, and/or a proximal connector of the PIM may be configured to couple the ultrasound imaging device 110, the PIM 131, and the control and processing system together mechanically and electrically. The system 100 may include may include a connector junction 111 comprising a proximal connector 209 of the ultrasound imaging device 110 and the distal connector of the PIM 131.

In some embodiments, the control and processing system 130 may include one or more computers, processors, and/or computer systems. The control and processing system 130 may also be referred to as a console. In some embodiments, the PIM 131 is in mechanical and electrical communication with the control and processing system 130, such that the electrical signals are transmitted the ultrasound imaging device 110 through the PIM 131 and to the control and processing system 130. The control and processing system 130 may include one or more processors and/or memory modules forming a processing circuit that may process the electrical signals and output a graphical representation of the imaging data on the monitor 132. One or more electrical conductors of the ultrasound imaging device 110 and PIM 131 may facilitate communication between the control and processing system 130 and the ultrasound imaging device 110. For example, a user of the control and processing system 130 may control imaging using the ultrasound imaging device 110 via a control interface 134 of the control and processing system 130. Electrical signals representative of commands from the control and processing system 130 may be transmitted to the ultrasound imaging device 110 via connectors and/or cables in the PIM 131 and the ultrasound imaging device 110. The control and processing system 130 may be transportable and may include wheels or other devices to facilitate easy transportation by a user.

In some embodiments, the one or more components of the ultrasound imaging device 110 may be disposable components. For example, a user, such as a physician, may obtain the catheter 101 and/or the ultrasound imaging device 110 in a sterilized packaging. In some embodiments, the ultrasound imaging device 110 may be disposed after a single use. In other embodiments, the ultrasound imaging device 110 can be sterilized and/or re-processed for more than one use. The PIM 131 may be a re-usable component that is used in multiple procedures. For example, the PIM 131 can be cleaned between individual procedures, such as being treated with disinfectants to kill bacteria. In some embodiments, the PIM 131 may not be required to be sterilized before a medical procedure. For example, the PIM 131 can be sufficiently spaced from the patient such that use of a non-sterile PIM 131 is safe for the patient. The sterile-nonsterile connection at the connector assembly 111 between the ultrasound imaging device 110 and the PIM 131 may allow for a safe operating environment while saving costs by allowing expensing equipment to be reused.

Figure 1B:
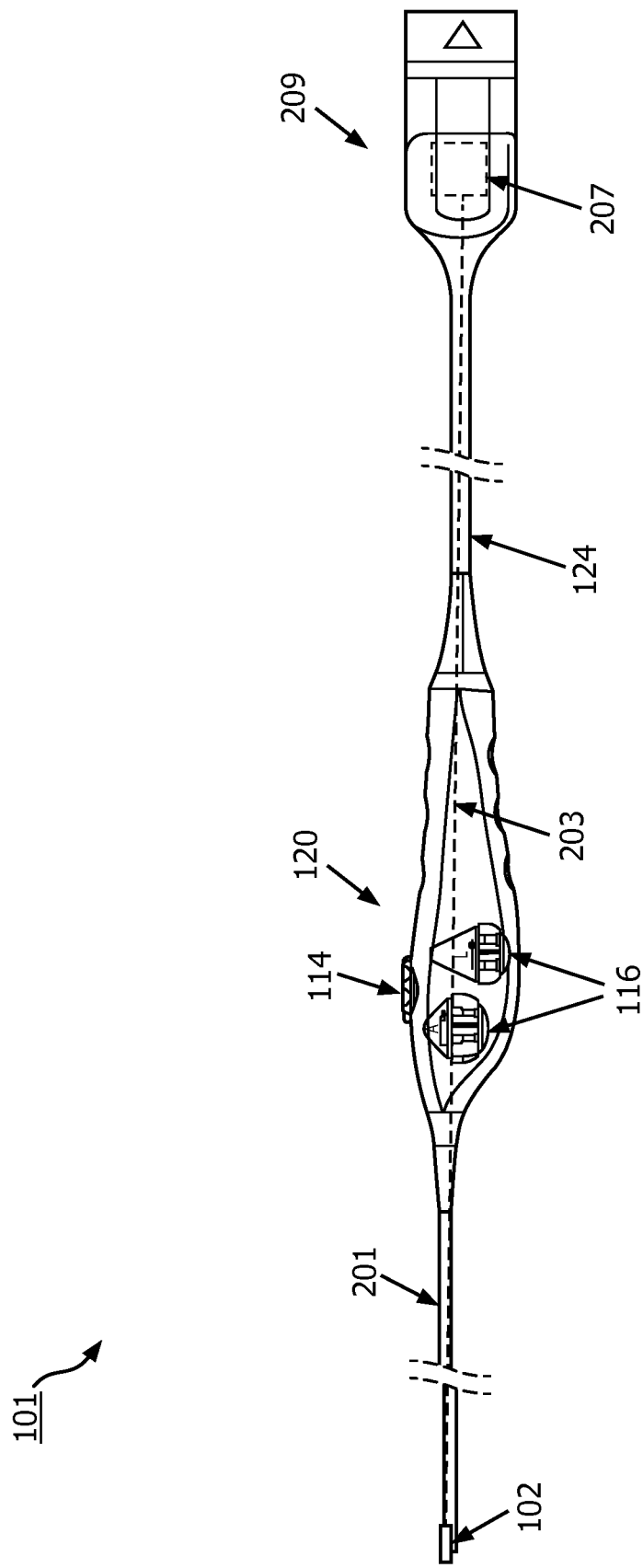
FIG. 1B is a schematic diagram of a catheter according to embodiments of the present disclosure.

FIG. 2 is a perspective view of the catheter cable 203 described above with respect to FIG. 1B. The catheter cable 203 is flexible elongate body 206 including a plurality of communication cables allow communication of imaging data and/or command signals between the processing system 130 and the catheter 101. The communication cables can be electrical wires. An individual electrical wire can include a bare conductor surrounded by one or more insulating layer (s) and/or shielding layer(s). The plurality of electrical wires collectively can be surrounded by one or more insulating layers(s) and/or shielding layer(s). An insulating layer may be formed of any suitable materials, such as a plastic or a polymer in some instances. A shield layer may be formed of any suitable material, such as a metal in some instances. For example, a woven layer 211, such as an RFI braid can surround the electrical wires. The cable 203 extends between the ultrasound imaging assembly 102 disposed at a distal portion 202 and PCBA 207 at a proximal portion 204. The flexible elongate body 206 extends between the distal end 202 and the proximal end 204. In some embodiments, the imaging assembly 102 is electrically and/or mechanically coupled (e.g., adhered or bonded) to distal end 202. During manufacturing, the imaging assembly 102 may be coupled to the catheter cable 203, prior to the cable 203 be sneaked through the catheter body or shaft. In some embodiments, the catheter cable 203 is about 4 feet long. In other embodiments, the catheter cable 203 is between 1 and 6 feet long or between 3 and 5 feet long, and/or other suitable values both larger and smaller.

Figure 3B:
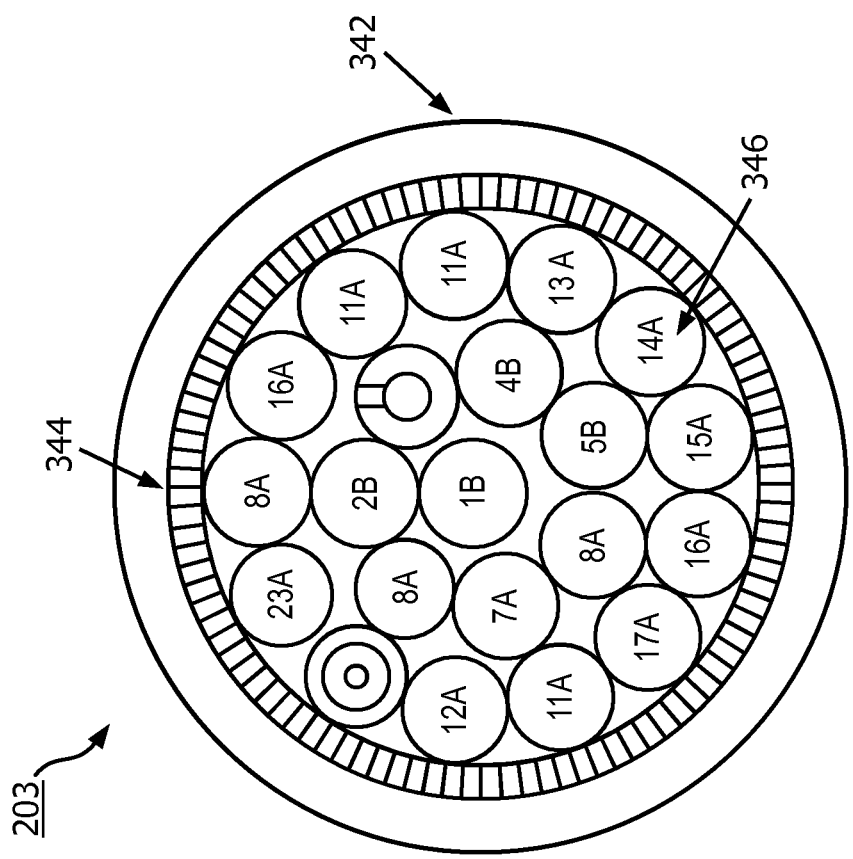
FIG. 3B is a cross-sectional view of a catheter cable according to embodiments of the present disclosure.
Figure 3A:
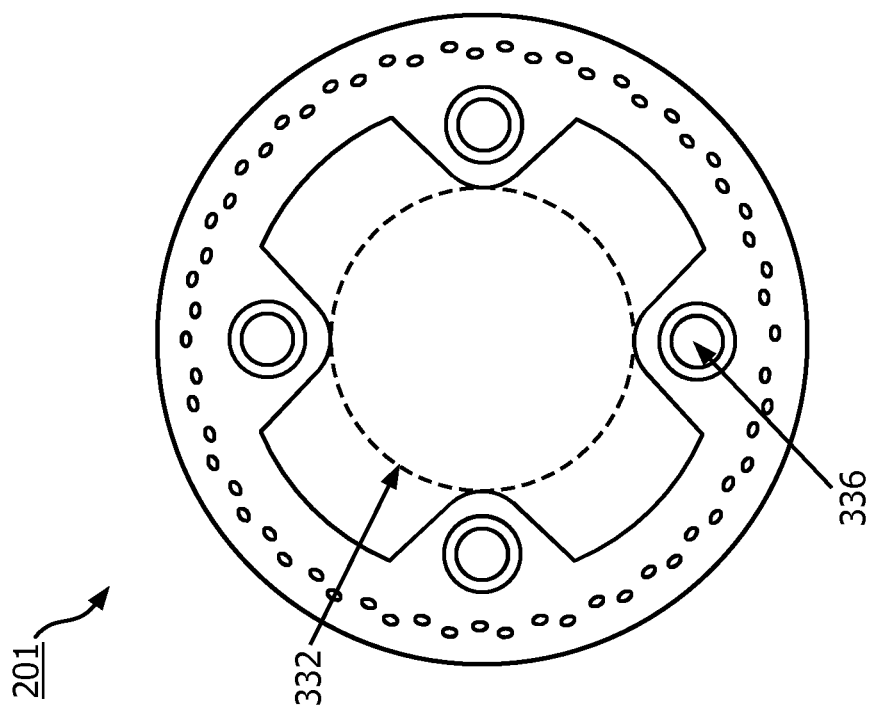
FIG. 3A is a cross-sectional view of a catheter body according to embodiments of the present disclosure.

FIG. 3A shows a cross-sectional view of a catheter shaft 201. The catheter shaft 201 is sized and shaped, structurally arranged, and/or otherwise configured to be positioned within the body lumen of a patient during the imaging procedure. The catheter cable 203 (as shown in FIGS. 2 and 3B) may be configured to be disposed within an internal lumen 332 of the catheter shaft 201. The catheter shaft 201 may include a number of pullwire lumens 336 disposed within the catheter shaft 201. Pull wires positioned within the lumens 336 control movement (deflection of the distal tip) of the distal portion of the catheter shaft and/or the imaging assembly 102. In some embodiments, the catheter shaft 201 has an outer diameter between approximately 1 mm and approximately 3 mm, including values both larger and smaller. In an exemplary embodiment, the catheter shaft 201 has an outer of about 1.422 (+/−0.025 mm).

FIG. 3B shows a cross-sectional view of a catheter cable 203. The catheter cable 203 (e.g., the PCBA 207 and the flexible elongate body 206) may sneaked or passed through the catheter shaft 201 during assembly. The PCBA 207 can be configured to directly or indirectly interface with a user console. For example, the PCBA 207 can be in direct or indirect communication with the console or processing system 130 and/or the PIM 131 (FIG. 1A). In some embodiments, the catheter cable 203 has a diameter between approximately 1 mm and approximately 3 mm, including values both larger and smaller. In an exemplary embodiment, the catheter cable 203 has a diameter of about 1.3 mm (+/−0.07 mm). In some embodiments, the catheter cable 203 may include a polymer layer 342, a shielding layer 344, and a number of electrical wires 346. The electrical wires 346 may be disposed within the shielding layer 342 which may be disposed within the polymer layer 342. The electrical wires 346 may be used to communicate signals from the imaging assembly to the proximal end 204, and ultimately to the processing system 130. In some embodiments, the shield layer 342 can be the woven layer 211 disposed around the polymer layer 342, as shown in FIG. 2. The electrical wires 346 connect the imaging assembly 102 and the proximal connector 209 (e.g., PCBA 207).

Figure 4:
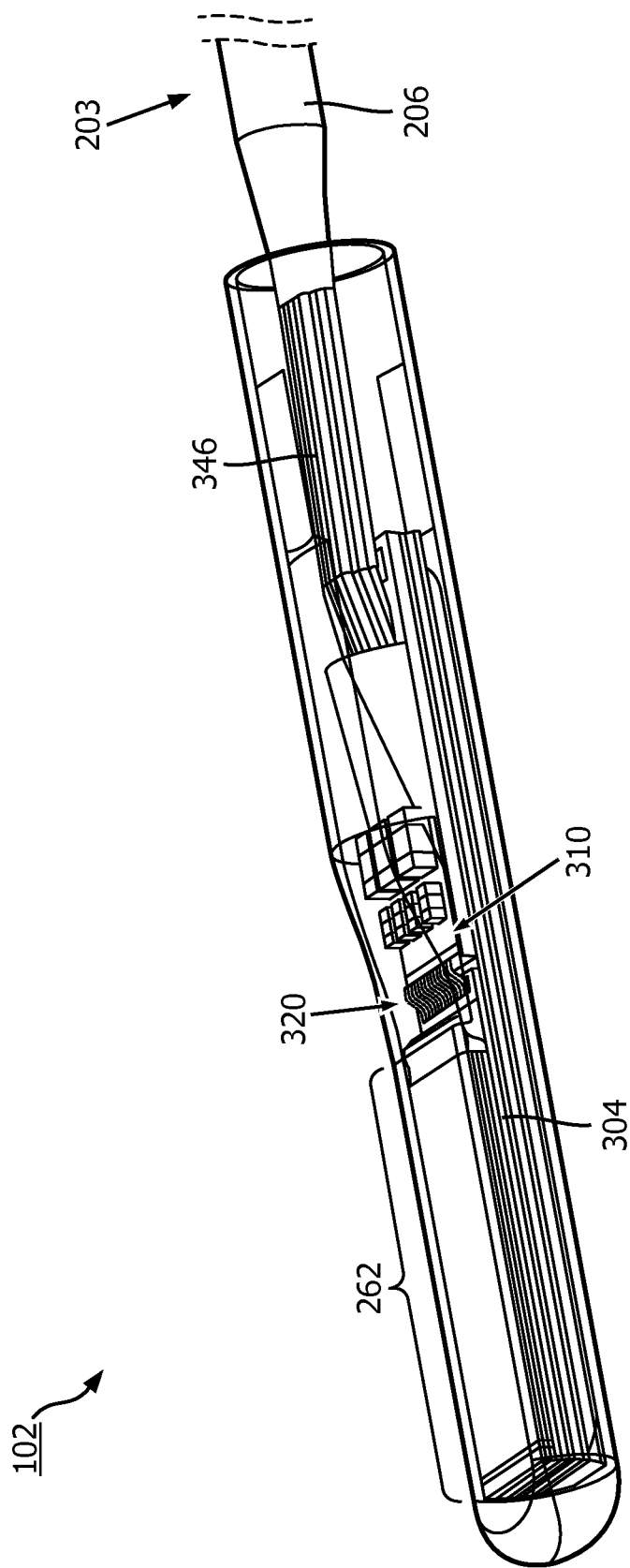
FIG. 4 is a perspective view of a distal ultrasound assembly of an intraluminal imaging device according to embodiments of the present disclosure.

FIG. 4 is a perspective view of the imaging assembly 102 according to embodiments of the present disclosure. The imaging assembly 102 is positioned at the distal portion of the catheter shaft 201 after assembly. The imaging assembly 102 is also positioned at the distal portion of the cable 203. The imaging assembly 102 may include an ultrasound transducer array 262 that includes a number of transducer elements and a micro-beam-former IC 304 that can be coupled to the transducer array 262. The electrical wires 346 of the cable 203 are mechanically and/or electrical coupled to the imaging assembly 102. In some examples, the electrical cable 203 is further coupled through an interposer 310 to the micro-beam-former IC 304. In some examples the interposer 310 is connected to the micro-beam-former IC 304 through wire bonding 320. The wires 346 of the cable 203 are directly or indirectly in communication with the transducer array 262, the IC 304, and/or the interposer 310.

In some embodiments, the transducer array 262 includes ultrasound imaging transducers that are directly flip-chip mounted to the micro-beam-former IC 304. The transmitters and receivers of the ultrasound imaging transducers are on the micro-beam-former IC 304 and are directly attached to the transducers. In some examples, a mass termination of the acoustic elements is done at the micro-beam-former IC 304.

In some examples, the transducer array 262 includes more than 800 imaging elements and the electrical cable 203 includes a total of 12 signal lines or less. In some examples, the electrical cable 203 includes a total of 30 lines or less that includes the signal lines, power lines, and control lines. In some examples, the transducer array 262 includes a one-dimensional or two-dimensional array from between 32 to 1000 imaging elements. For example, the array can include 32, 64, 128, 256, 512, 640, 768, or any other suitable number of imaging elements. For example, a one-dimensional array may have 32 imaging elements. A two-dimensional array may have 32, 64, or more imaging elements. In some examples, the number of signal lines is between 10 and 20, for example, 12 signal lines, 16 signal lines, or any other suitable number of signal lines. A one-dimensional array can be configured to generate two-dimensional images. A two-dimensional array can be configured to generate two-dimensional and/or three-dimensional images.

In some examples, the electrical cable 203 of the imaging assembly 102 is directly coupled to the micro-beam-former IC 304 of the imaging assembly 102. In some embodiments, the micro-beam-forming IC 304 lies directly underneath the transducer array 262 and is electrically connected to them. The elements of the transducer array 262 may be piezoelectric or micromachined ultrasonic transducer (MUT) elements. In some examples, piezoelectric elements are attached to the IC 304 by flip-chip mounting of an assembly of acoustic layers that include sawing into individual elements. MUT elements may be flip-chip mounted as a unit or grown directly on top of the micro-beam-forming IC 304. In some examples, the cable bundle may be terminated directly to the micro-beam-forming IC 304, or may be terminated to an interposer 310 of suitable material such as a rigid or flexible printed circuit assembly. The interposer 310 may then be connected to the micro-beam-forming IC 304 via any suitable means such as wire bondings 320.

Figure 5:
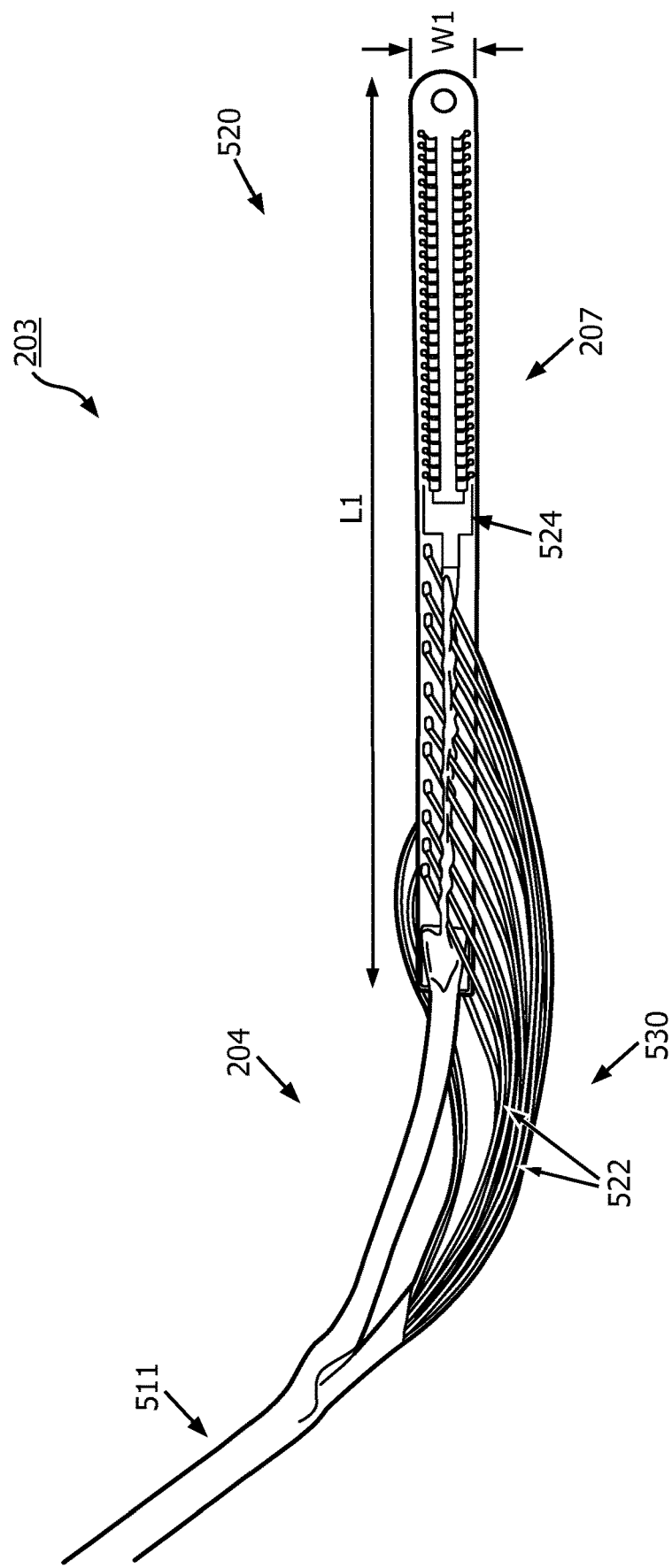
FIG. 5 is a perspective view of a proximal portion of a catheter cable according to embodiments of the present disclosure.

FIG. 5 is a perspective view of the proximal portion 204 of the catheter cable 203. In some embodiments, the proximal portion 204 includes a proximal portion 511 of the flexible elongate body 206 in communication with the PCBA 207 and a transition portion 530 connecting the proximal portion 511 and the connector 520. The connector 520 can be in the form of PCBA 207. The transition portion 530 may include a plurality of electrical wires 522 that are attached to a substrate 524 of the connector 520. In some embodiments, the substrate 524 may have a length L1 of approximately 1.2 inches. The length L1 may be between 1 and 1.25 inches, between 0.5 and 1.5 inches, or between 1.2 and 1.3 inches, and/or other values both larger and smaller.

The substrate 524 may have a width W1 of approximately 0.08 inches. The width W1 may be between 0.05 and 0.10 inches, between 0.075 and 0.085 inches, or between 0.07 and 0.09 inches, and/or other values both larger and smaller. The substrate 524 generally extends lengthwise or longitudinally, without a large width. The small size of the substrate 524 and fine electrical wires 522 may provide for a smaller PCBA 207 within the connector 520 and allow the proximal end 204 to be sneaked through a catheter after assembly.

FIG. 6A is a magnified view 700 of the transition portion 530 shown in FIG. 5. The electrical wires 522 may be seen extending from the flexible elongate body 206 to the substrate 524. In some embodiments, the transition portion 530 includes 21 electrical wires 522. In other embodiments, 10-15, 15-20, 20-25, 30-50, and/or other quantities of electrical wires 522 are included in the transition portion 530. The electrical wires 522 may be passed through the body 206 from imaging assembly 102 to the PCBA 207. In some embodiments, the electrical wires 522 are attached to the substrate 524 at an angle.

For example, FIG. 6B shows a further magnified view of the electrical wires 522 attached to the substrate 524. In some embodiments, the electrical wires 522 are attached at an angle α with reference to the orientation of the substrate 524. For example, angle α may measure between 15 and 45 degrees, between 20 and 30 degrees, between 15 and 60 degrees, between 30 and 60 degrees, between 10 and 80 degrees, or between 0 and 90 degrees, including values such as 30 degree, 45 degrees, 60 degrees, and/or other values both larger and smaller. The electrical wires 522 may be attached at the angle α to allow the electrical wires 522 to fold when the proximal end 204 is sneaked through the catheter shaft 201. The electrical wires 522 are configured to move from a first position when placed in the shaft 201 to a second position when extending out of the shaft 201. In particular, the electrical wires 522 may fold up in the direction of substrate 524 during compression (e.g., inside the shaft 201), such that they are not damaged or detached from the substrate 524. When the electrical wires 522 can fold down, away from the PCBA, when the assembly is positioned outside of the shaft 201. The plurality of electrical wires 522 can be soldered along one or more lines extending a length of the PCBA 207. For example, the plurality of electrical wires 522 can be soldered along a single line extending across the substrate 524 of the PCBA 207. Each electrical wire 522 is soldered or adhered to a corresponding conductive portion (e.g., a contact) of the substrate 524 at a bond 712. The electrical wire 522 can include a bare conductor that is soldered at the bond 712, a first insulating layer 714, and a second insulating layer 716. The electrical wire 522 can be may be connected to ground on the substrate 524, such as a ground strip 806 of the substrate 524. The ground strip 806 can be formed of any suitable metal, such as silver, copper, gold, or aluminum. For example, the electrical wire 522 can be soldered or adhered to the ground strip 806 along the first insulating layer 714. The insulating layer 714 and/or 716 may include a polymer material. In some embodiments, the substrate 524 includes an isolation portion 720 that is not populated with bonds 712. This may allow room for the electrical wires 522 to fold up during sneaking procedures. In some embodiments, the electrical wires 522 are terminated on the substrate 524 such that the electrical wires 522 extend out from the substrate 524 at distance of 1.4 mm or less. In other embodiments, the electrical wires 522 extend out from the substrate with a distance of 2.0 mm, 1.5 mm, 1.3 mm, 1 mm, or other distances. In some embodiments, the PCBA 207 and electrical wires 522 terminated thereon together are configurable to form a cross-sectional area of 2 mm² or less. In other embodiments, the electrical wires 522 extending out from the substrate 524 form a cross-sectional area of 5 mm², 3 mm², 1.5 mm², 1 mm², or less.

Figure 7:
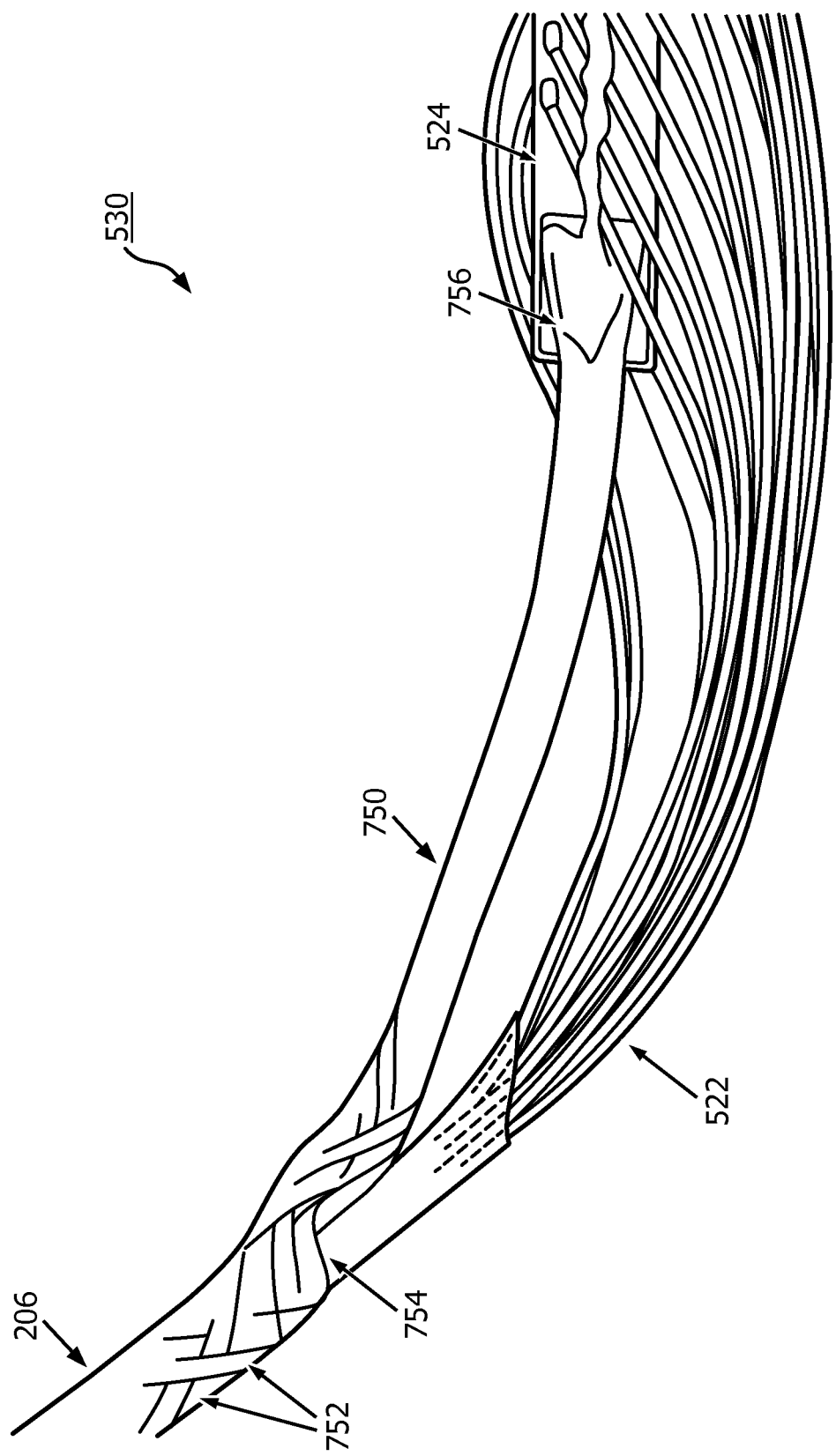
FIG. 7 is a perspective view of the transition section and radio frequency immunity (RFI) braid of the proximal portion of the catheter cable according to embodiments of the present disclosure.

FIG. 7 shows another view of the transition portion 530. The catheter cable 203 can include a knitted outer portion (or sheath) surrounded the plurality of electrical wires. For example, the knitted outer portion can be a radio frequency immunity (RFI) braid. In some embodiments, the RFI braid 750 extends from the flexible elongate body 206 to the substrate 524 of the PCBA 207. The RFI braid 750 may include a woven material formed from one or more fibers 752. The fibers 752 comprise a metal in some instances. The RFI braid 750 may provide electrical shielding for the connector 520 as well as strengthening the connection between the flexible elongate body 206 and substrate 524.

As shown in FIG. 7, a portion of the RFI braid 750 is not disposed around the electrical wires 522 before they are terminated on the substrate 524, such that a portion of the RFI braid 750 runs parallel to a portion of the length of the electrical wires 522. In some embodiments, the RFI braid 750 surrounds a portion of the electrical wires 522 and the electrical wires 522 are passed through an enlarged hole or opening 754 in the braid weaving of the RFI braid 750. The opening 754 is located distal of the proximal end of the flexible elongate body 206. A proximal end of the RFI braid 750 that does not enclose the electrical wires 522 may be attached to the distal end of the substrate 524 at bond 756. The sheath or RFI braid 750 is terminated on the PCBA 207 at a position distal to the termination of the electrical wires 522. The RFI braid 750 may be soldered, adhered, or otherwise bonded to the substrate 524. For example, during a sneaking operation in assembly, the substrate 524 may be subjected to forces pulling the proximal end 204 (e.g., pulling at the opening 808 of FIG. 8) through the catheter shaft 201. These forces may be transferred to the flexible elongate body 206 and/or the RFI braid 750 at bond 756, such that force is not transferred to the electrical wires 522 at the bonds 712, thereby protecting the electrical wires 522 and/or their interconnection to the substrate 524 during assembly. In some embodiments, the RFI braid 750 may be configured to withstand 1.5 lbs of force applied to the proximal end 204. In other embodiments, the RFI braid 750 may be configured to withstand 1, 2, 3, 5 lbs of force, and/or other values both larger and smaller.

Figure 8:
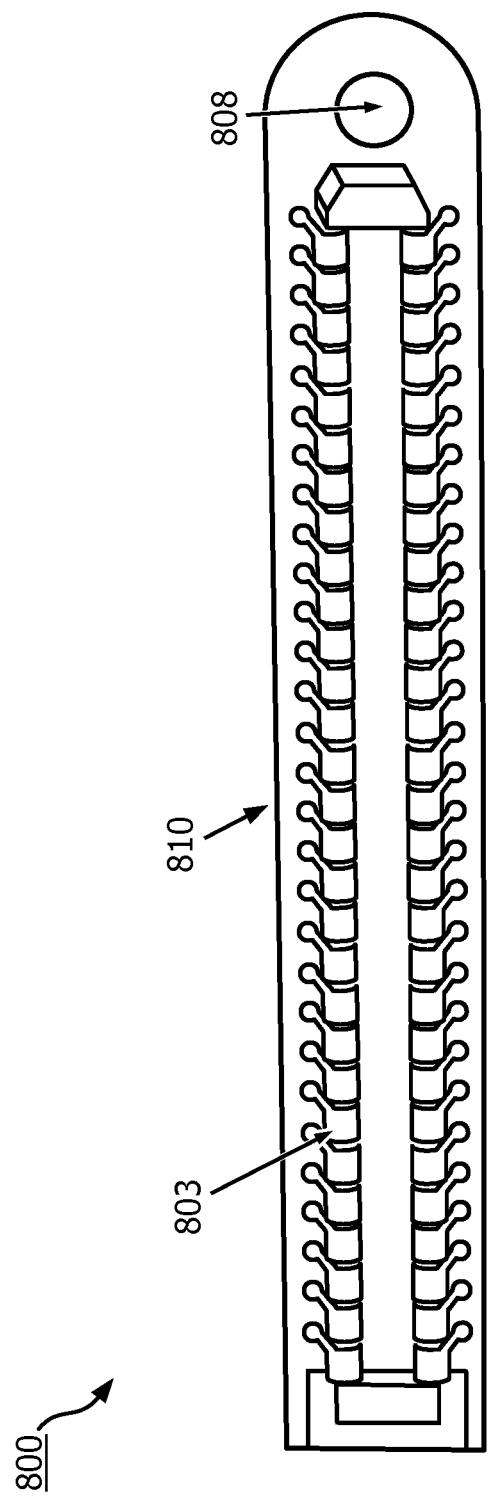
FIG. 8 is a perspective view of a portion of a PCB at the proximal portion of the catheter cable according to embodiments of the present disclosure.
Figure 9:
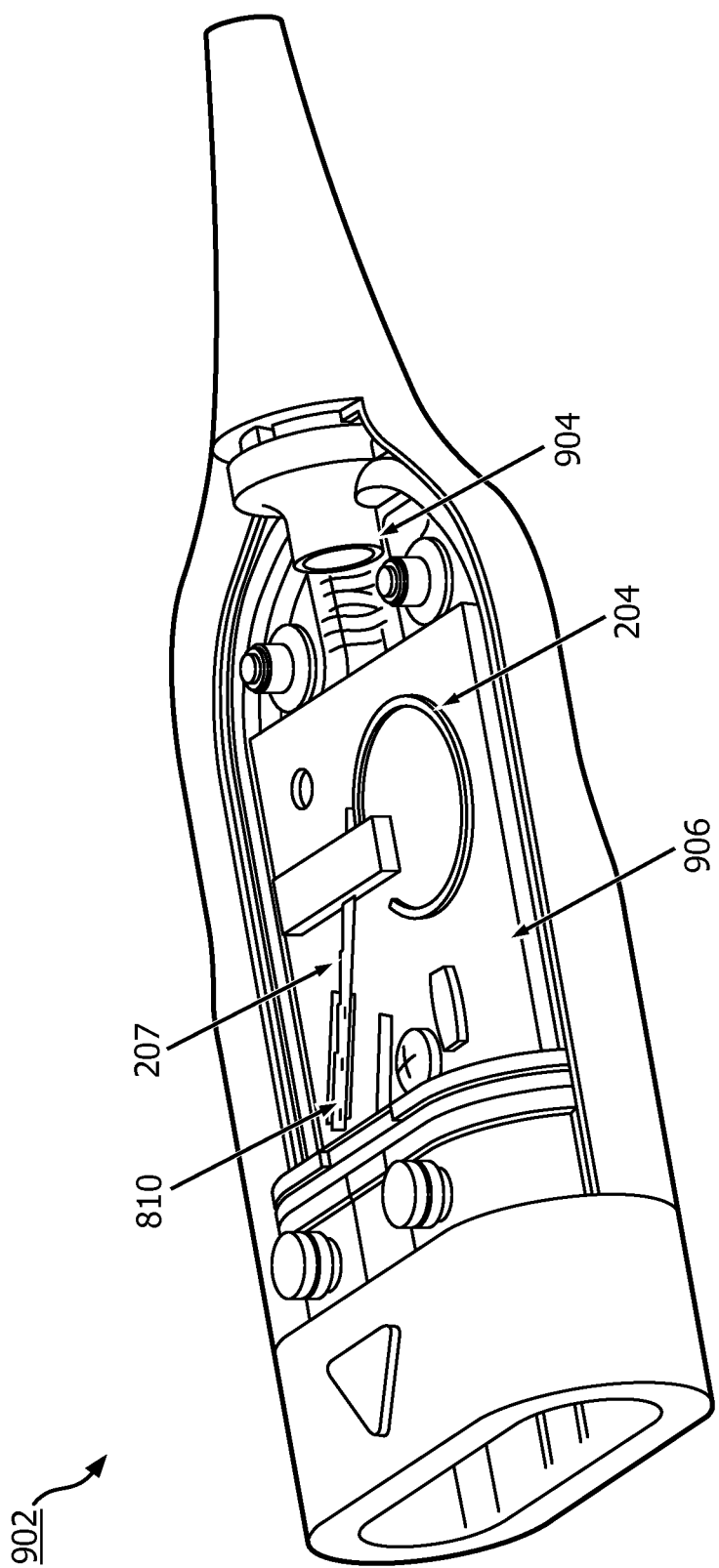
FIG. 9 is a view of the proximal end of the catheter cable attached to a connector according to embodiments of the present disclosure.

FIG. 8 shows a magnified view of a proximal portion 800 of the substrate 524 shown in FIG. 5. The proximal portion 800 may be attached to a connector after the proximal end 204 is sneaked through a catheter. In some embodiments, the proximal portion 800 includes a low profile surface mount connector 810 which may include a number of miniaturized connectors 803 on the substrate 524. The miniaturized connectors 803 may be attached to corresponding connectors without requiring soldering or adhesive, as shown in FIG. 9. In some embodiments, the proximal portion 800 may include a row of pads suitable for use with a male type connector (which may also be mounted to the substrate 524) and/or an elastomeric type connector. The proximal portion 800 may include an opening 808 that may be used during a sneaking operation. For example, an instrument may be passed through the opening 808 and used to pull the substrate 524 through the length of the catheter body 201.

FIG. 9 shows the proximal portion 204 of the catheter cable 203 attached to a connector 902 at the proximal portion of the catheter 101. The cable 203 may pass through an opening 904 at the distal portion of the connector 902. The connector 902 includes a PCBA 906 including one or more electronic components. The PCBA 207 at the proximal portion of the cable 203 is electrically and mechanically coupled to the PCBA 906. For example, the surface mount connector 810 at the proximal portion 800 of the PCBA 207 is engaged with a corresponding connector on the PCBA 906. The connector 902 is configured to be mechanically and electrically in communication with the PIM 131 (FIG. 1A). In this manner, electrical signals can be communicated between the processing system 130 and the ultrasound imaging assembly 102 via the cable 203 and the PIM 131.

Figure 10:
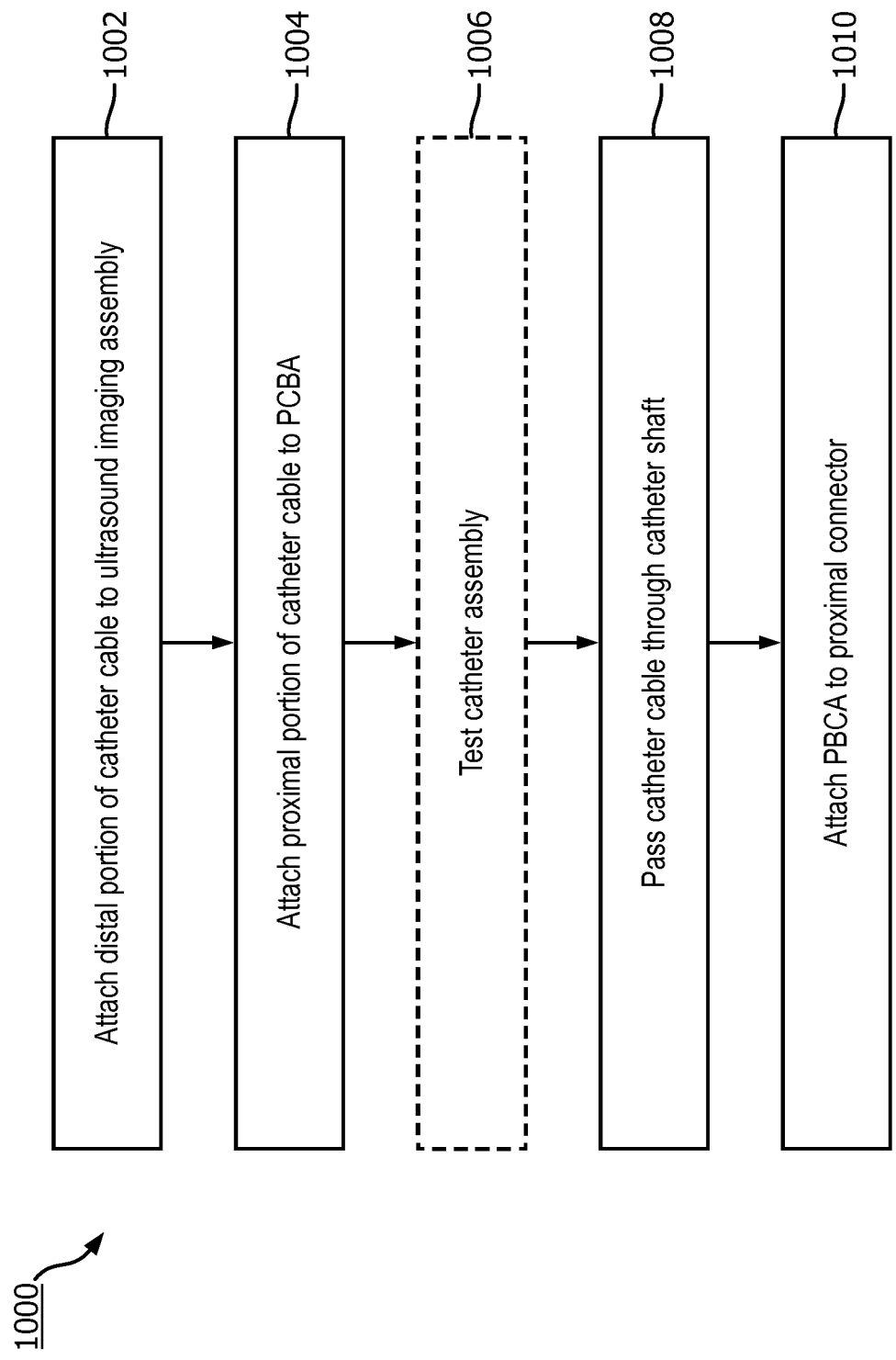
FIG. 10 is a flow diagram illustrating a method of assembling an intraluminal ultrasound imaging device according to embodiments of the present disclosure.

FIG. 10 provides a flow diagram illustrating a method 1000 of assembling an ultrasound imaging device, such as the ultrasound imaging device 110 as shown in FIGS. 1-2. As illustrated, the method 1000 includes a number of enumerated steps, but embodiments of the method 1000 may include additional steps before, after, and in between the enumerated steps. In some embodiments, one or more of the enumerated steps may be omitted, performed in a different order, or performed concurrently.

At step 1002, the method 1000 may include attaching a distal portion of a catheter cable to an ultrasound imaging assembly. In some embodiments, the catheter cable is similar to the flexible elongate body 206 (FIG. 2). The catheter cable may include one or more electrical wires as well as an outer layer. The electrical wire(s) of the catheter cable can be mechanically and/or electrically coupled to the ultrasound imaging assembly after attachment. The ultrasound imaging assembly can be disposed at the distal portion of the catheter cable. The attachment can be direct or indirect. For example, the cable can be directly coupled to an interposer, which is coupled to the ultrasound transducer array and/or IC. The catheter cable may be soldered, bonded, adhered, or otherwise attached to the imaging assembly.

At step 1004, the method 1000 may include attaching a proximal portion of a catheter cable to PCBA(s). In some embodiments, the proximal portion of the catheter cable and the PCBA are illustrated, e.g., in FIGS. 2, 5, 6A, 6B, 7, and 8. In some embodiments, electrical wires of the catheter cable are terminated at corresponding conductive portions of a PCBA substrate. In some embodiments, one or more portions of the PCBA can be a flexible substrate. In some embodiments, one or more portions of the PCBA can be a rigid substrate. The proximal connector may be configured to be attached to a PIM or cable that is ultimately connected to a processing system. In some embodiments, the electrical wires of the catheter cable are attached to the PCBA substrate via a foldable connection such as that shown in FIGS. 5-9. The electrical wires may be attached to the substrate at an angle. In some embodiments, the catheter cable includes an RFI braid which is mechanically connected to the substrate (e.g., soldered, bonded, adhered, and/or otherwise attached). The electrical wires may be passed through a hole in the RFI braid such that they extend between the RFI braid and the substrate. The portion of the RFI braid without the electrical wires is attached to the substrate. This structural arrangement advantageously allows the PCBA and the attached catheter cable to pulled through a catheter body (step 1008) during assembly without such that the substrate may be sneaked through a catheter without damaging the electrical interconnection between the wires and the PCBA. For example, the electrical wires can fold in towards the substrate to minimize the outer profile, size, and/or diameter of the proximal portion of the catheter cable. Additionally, the mechanical attachment between the RFI braid and the substrate allows for pulling forces to the transferred to the RFI braid rather than to the electrical wire interconnections. The PCBA substrate may include a low profile surface mount connector.

At step 1006, the method 1000 may optionally include testing the catheter assembly including the electrical wires of the catheter cable, the ultrasound imaging assembly (e.g., the transducer array and/or IC), and the proximal PCBA. For example, the testing can ensure that electrical signals representative of commands from the console are being transmitted from the proximal PCBA to the ultrasound transducer array at the distal portion via the electrical wires. The testing can also ensure that the electrical signals representative of ultrasound imaging data are being transmitted from the ultrasound transducer array to the proximal PCBA. The testing may include checking the alignment of the electrical wires, the PCBA, and the ultrasound imaging assembly, and the quality of soldering, bonding, wirebonding, and/or overcoating of the constituent parts. The step 1006 can be performed at any point during the assembly process and can be repeated as needed to ensure that electrical communication has not be damaged as a result of manufacturing steps. The testing of the catheter assembly may avoid waste by preventing faulty components from being paired with expensive components before detection. The ability to test the entire catheter assembly before shipping and installation may further simplify manufacturing steps.

At step 1008, the method 1000 may include passing or sneaking the catheter cable through the length of the catheter shaft. In some embodiments, the proximal PCBA is also sneaked through the catheter shaft. For example, the proximal PCBA at the proximal portion of the cable can be inserted into the lumen at the distal end of the catheter shaft. An instrument can be used to connect to the proximal PCBA (e.g., at the opening 808 of FIG. 8). The proximal PCBA and the catheter cable can be pulled, within the lumen, through the length of the catheter shaft from the distal portion of the catheter shaft to the proximal portion of the catheter shaft. In some embodiments, the cable can be passed from the proximal portion of the catheter shaft to the distal portion of the catheter shaft. Step 1008 may include folding electrical wires of the cable towards the substrate to reduce the diameter of the proximal portion of the cable (e.g., the electrical wires connected to the PCBA). Step 1008 can also include transferring pulling forces on the proximal PCBA to the RFI braid, rather than to the electrical wires. The method 1000 can also include pass the catheter cable through the handle of the catheter and/or through a conduit that extends from the handle to the proximal connector.

At step 1010, the method 1000 may include attaching the PCBA at the proximal portion of the catheter cable to a PCBA within the proximal connector. In some embodiments, a low profile surface mount connector of the proximal connector is attached to a corresponding connector on the PCBA within the proximal connector. In other embodiments, the PCBA at the proximal portion of the catheter cable and/or the electrical wires are soldered, adhered, and/or otherwise coupled to one or more electronic components within the proximal connector.

Persons skilled in the art will recognize that the apparatus, systems, and methods described above can be modified in various ways. Accordingly, persons of ordinary skill in the art will appreciate that the embodiments encompassed by the present disclosure are not limited to the particular exemplary embodiments described above. In that regard, although illustrative embodiments have been shown and described, a wide range of modification, change, and substitution is contemplated in the foregoing disclosure. It is understood that such variations may be made to the foregoing without departing from the scope of the present disclosure. Accordingly, it is appropriate that the appended claims be construed broadly and in a manner consistent with the present disclosure.

What is claimed is:

1. A system, comprising:
an intraluminal device configured to be positioned within a body lumen of a patient, the intraluminal device comprising a proximal portion and a distal portion, wherein the intraluminal device further comprises:
a sensor disposed at the distal portion;
a proximal connector comprising a printed circuit board assembly (PCBA) disposed at the proximal portion, wherein the PCBA comprises:
a long axis;
a short axis perpendicular to the long axis and extending between a first side and an opposite, second side; and
a plurality of contacts arranged in a line extending in a direction of the long axis; and
a plurality of electrical wires connecting the sensor and the proximal connector,
wherein the long axis of the PBCA is oriented parallel to a length of the plurality of electrical wires,
wherein each electrical wire of the plurality of electrical wires comprises a proximal section terminating at a proximal end,
wherein the proximal end of each electrical wire is attached to a respective contact of the plurality of contacts of the PCBA,
wherein the proximal section of each electrical wire extends at an oblique angle with respect to the line,
wherein the proximal section of the plurality of electrical wires is separate from the PCBA, and
wherein the proximal section of each electrical wire extends outside of the short axis.

2. The system of claim 1, wherein the intraluminal device further comprises a sheath disposed around at least a portion of the plurality of electrical wires and terminating on the PCBA.

3. The system of claim 2, wherein the sheath is braided.

4. The system of claim 2, wherein a length of the sheath prior to terminating at the PCBA is not disposed around the plurality of electrical wires, and wherein the length of the sheath runs parallel to the plurality of electrical wires.

5. The system of claim 2, wherein the sheath is terminated on the PCBA at a position distal to termination of the plurality of electrical wires on the PCBA.

6. The system of claim 1, wherein the plurality of electrical wires are arranged to be foldable when the intraluminal device is passed through a catheter body.

7. The system of claim 1, wherein the oblique angle is between 10 degrees and 80 degrees with respect to the long axis of the PCBA.

8. The system of claim 1, wherein the oblique angle is between 30 and 60 degrees with respect to the long axis of the PCBA.

9. The system of claim 1, wherein the proximal end of each electrical wire is soldered onto the respective contact.

10. The system of claim 1,
wherein the line comprises a single line, and
wherein the proximal end of each electrical wire is soldered along the single line.

11. The system of claim 1, wherein the plurality of electrical wires pass through an opening distal of the proximal portion of the intraluminal device.

12. The system of claim 11,
wherein the intraluminal device comprises a knitted outer portion,
wherein the opening is in the knitted outer portion.

13. The system of claim 12, wherein a proximal end of the knitted outer portion is coupled to a distal end of the PCBA and is adjacent to the plurality of electrical wires coupled to the PCBA.

14. The system of claim 13,
wherein the plurality of electrical wires,
wherein the knitted outer portion runs parallel to the plurality of electrical wires.

15. The system of claim 1,
wherein the plurality of electrical wires are coupled to a plurality of pads, respectively, and
wherein the plurality of pads extend colinearly along the length of the PCBA.

16. The system of claim 1, wherein the plurality of electrical wires are coupled to a ground of the PCBA.

17. The system of claim 1,
wherein a distal section of the plurality of electrical wires is parallel to a plane defined by the long axis and the short axis,
wherein the PCBA and the plurality of electrical wires extending from the PCBA together form a cross-sectional area of 2 mm$^2$ or less,
wherein the plurality of electrical wires terminate on the PCBA.

* * * * *